(12) United States Patent
Jackson

(10) Patent No.: US 7,351,998 B2
(45) Date of Patent: Apr. 1, 2008

(54) PROTON OR ION MOVEMENT ASSISTED MOLECULAR DEVICES

(75) Inventor: Thomas N. Jackson, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 928 days.

(21) Appl. No.: 10/112,075

(22) Filed: Mar. 29, 2002

(65) Prior Publication Data

US 2002/0149809 A1 Oct. 17, 2002

Related U.S. Application Data

(60) Provisional application No. 60/280,236, filed on Mar. 30, 2001.

(51) Int. Cl.
*H01L 35/24* (2006.01)
*H01L 29/06* (2006.01)

(52) U.S. Cl. ............................................ 257/40; 257/24
(58) Field of Classification Search ................. 257/40, 257/24
See application file for complete search history.

(56) References Cited

U.S. PATENT DOCUMENTS

| 5,475,341 A | 12/1995 | Reed .......................... 327/566 |
| 5,589,692 A | 12/1996 | Reed .......................... 257/23 |
| 6,259,277 B1 | 7/2001 | Tour et al. .................. 326/136 |
| 6,320,200 B1 | 11/2001 | Reed et al. .................. 257/40 |
| 6,339,227 B1 | 1/2002 | Ellenbogen .................. 257/40 |

OTHER PUBLICATIONS

International Search Report dated Aug. 21, 2002 for PCT Patent Application No. PCT/US02/09753, Filed Mar. 29, 2002.

*Primary Examiner*—Ori Nadav
(74) *Attorney, Agent, or Firm*—Gifford, Krass, Sprinkle, Anderson & Citkowski, P.C.

(57) ABSTRACT

There are disclosed molecular scale devices for performing logic functions. Devices comprise at least one input molecular unit, at least one output molecular unit, at least one molecular unit for performing logic or memory functions, and a means for effecting charge transport. Devices of the invention are useful for a variety of electronic and optoelectronic applications.

12 Claims, 2 Drawing Sheets

PROTON OR ION MOVEMENT ASSISTED MOLECULAR DEVICES

This application claims priority from U.S. Provisional Application No. 60/280,236, filed Mar. 30, 2001.

BACKGROUND OF THE INVENTION

1. Field of the Invention

The present invention relates to the field of molecular electronics. Molecular assemblies having a variety of electronic and optoelectronic applications are disclosed.

2. Description of the Prior Art

A variety of advances have recently been made in the field of molecular electronics. It has been established that it is possible to fabricate individual molecules or molecular-scale devices that perform functions identical or comparable to functions performed by current microcircuit devices. Individual molecules have been shown to function as diodes and to conduct and switch electric current as well as store information.

Recently, negative differential resistivity and signal storage effects have been demonstrated in molecular monolayers. These effects are of great interest because they point to the possibility of molecular-scale electronic devices. The proposed mechanism for the negative differential mobility and/or molecular signal storage involves charge transport and/or charge storage in single molecules or groups of similar or identical molecules. Donhauser, Z. J., et al, Sci. 292, 2303-2307 (2001); Seminario, J. M., et a., J. Am. Chem. Soc. 122, 3015-3020 (2000). More generally, it has been taught that so-called electron barrier-well-barrier molecular structures or more complex combinations of electron barriers and wells can be used to provide a range of useful molecular devices. U.S. Pat. Nos. 5,475,341 is directed to sub-nanoscale electronic systems and devices. This patent provides thin film barrier-well-barrier molecules between contact pads. U.S. Pat. No. 5,589,692 is also directed to sub-nanoscale electronic systems and devices. This patent provides devices having a well, multiple barriers, and molecular conductor chains. U.S. Pat. No. 6,320,200 is directed to a process for manufacturing sub-nanoscale electronic devices comprising polymeric conductors. In particular, it is taught that the electron barriers and wells are created by the specific molecular configuration used and that the charge transport and/or storage occurs on individual molecules.

There are inherent limitations in current microelectronic technology in commerce today. Although solid state and silicon based microelectronics has advanced markedly in recent years, there are, for example, limits to the number of transistors that can be placed on a silicon integrated circuit. Commercial transistors are orders of magnitude larger than molecular scale devices. In order to continue the current rate of growth in computing speed which will soon reach its theoretical limits, molecular scale devices will have to be developed.

Accordingly, an object of the invention is to provide molecular devices suitable for electronic applications.

It is another object of the invention is to provide molecular devices suitable for optoelectronic applications.

It is yet another object of the invention to provide molecular scale devices that perform logic or memory functions that involve proton or ion movement.

These and other objects and advantages of the present invention and equivalents thereof, are achieved by molecular scale devices for electronic or optoelectronic utilization.

SUMMARY OF THE INVENTION

The present invention provides molecular devices comprising at least one input molecular unit, at least on output molecular unit, and at least one internal molecular and charge transport unit connected at one terminus to said input molecular unit and connected at another terminus to said output molecular unit, wherein said molecular component of said molecular and electrolyte unit performs memory or logic functions using molecular electrostatic potential based on perturbing the electrostatic potential of at least one molecule. Also, the present invention provides at least one input molecular unit, at least one output molecular unit, a charge transport means contacting said input molecular unit; and at least one molecular unit for performing memory or logic functions contacting said charge transport means using molecular electrostatic potential based on pertrubing the electrostatic potential of at least one molecule. The devices of the invention are suitable for electronic and optoelectronic applications.

DETAILED DESCRIPTION OF THE INVENTION

Figure 1:
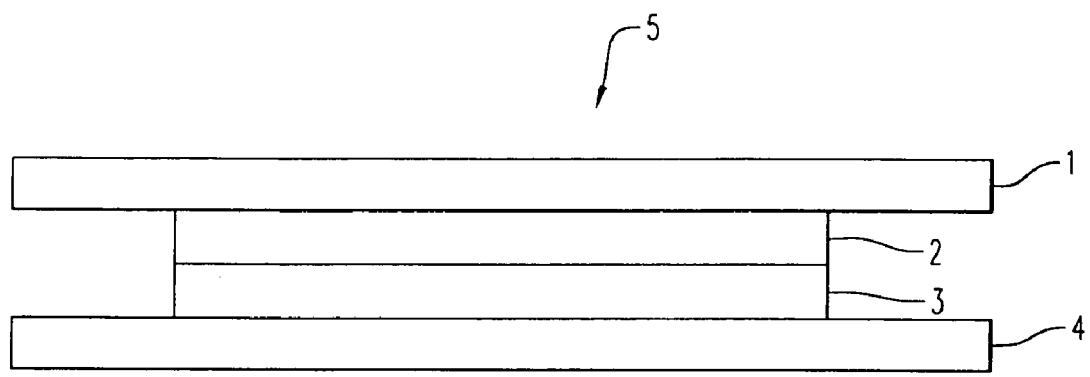
FIG. 1 is a molecular scale device having a distinct molecular storage layer and a distinct electrolyte layer.

We have evidence that the thus-far observed molecular-based negative differential resistance and charge storage are not native single molecule effects but instead rely on the motion of charge external to the intended charge transport molecules and that this external charge is essential to achieve the observed molecular negative differential resistance and/or charge storage. Thus, the observed electrical characteristics rely on proton, ion or other charge insertion or motion external to, but proximate with, the intended charge transport within the molecules.

The observed molecular effects are thus somewhat similar to better-known electrochromic materials where an electrically or chemically driven change in the oxidation state of the active material is accompanied by ion insertion to maintain local charge neutrality and is used to provide persistent color changes. For such materials the environment in which the charge or dopant is able to move to allow stable changes in the overall system is important. For example, conjugated polymers that can be repeatedly driven from conducting to insulating states form one important class of electrochromic material. For such materials, an electrolyte of some type or other source of protons or ions that allows charge movement external to the conjugated polymer is typically important.

The present invention provides that an electrolyte or other source of protons or ions or at least localized charge is essential for many molecular-scale devices including, but not limited to, molecular storage devices and molecular monolayer devices. As an example, the electrolyte can be selected from $H^+$, $Li^+$, $Na^+$, $K^+$, $(CH_3)4N^+$, $(C_4H_9)_4N^+$, $NH_4^+$, $Mg^{+2}$, $Ca^{+2}$, $Cl^-$, $Br^-$, $I^-$, $ClO_4^-$, $BF_4^-$, $PF_6^-$, $SO_4^{-2}$, $NO_3^-$, $PO_3^{-2}$, $OH^-$, $CO_3^{-2}$, $CH3COO^-$, $AsF_6^-$, $CF_3SO_3^-$, $CFCOO^-$, $[N(CF_3SO_2)_2]^-$, $[N(CF_3SO_2)(CH_2)_3OCH_3]^-$, $[(CF_3SO_2)_2,CH]^-$ or any combination thereof. For molecular scale devices known in the art, the electrolyte may well have been simply water that was inadvertently introduced into the device during a low-temperature process step. The molecular scale devices of the art use a so-called nanopore to provide small active device area for improved yield. After nanopores are formed and metallized on one side, the desired molecule is added using standard molecular self-assembly techniques. A second layer of metal is then added to the nanopore to complete the sandwich structure molecular device. During this second metallization step the sample is cooled to low temperature (near liquid nitrogen temperature) with the goal of avoiding damage to the molecular layer and/or of reducing the mobility of incoming metal atoms. However, the process step is done using a vacuum system with relatively high base pressure which will deposit water (as ice) on the molecular sample at about 0.1 monolayer per second. The water will melt when the sample warms and will serve as the electrolyte for ion transport.

Ion transport is relatively slow compared to molecular electron transport. For example, electrochromic devices typically require milliseconds to seconds to operate. However, electrochromic devices are typically relatively thick (often microns in thickness) in order to provide sufficient optical density. Molecular electronic devices can be very thin and ion insertion can therefore be much faster. For example, molecular electronic devices known in the art use a single monolayer. By proper choice of electrolyte or other charge transport medium it is even possible to use sub-monolayer films or even films with isolated molecules (in this case an electrolyte or material that allows ion insertion, but not ion transport between device electrodes, would be used).

Although the discussion above considers an electrolyte embodiment as a medium to allow charge insertion in the molecular layer, what is essential is the ion motion. Thus, a wide variety of device designs are possible. A wide variety of electrolytes or suitable charge transport media are possible and may conveniently be selected form those known in the art, including both solid and liquid forms. Although molecular scale devices known in the art may have inadvertently used water as the electrolyte, possibly modified by process contaminants, solid electrolytes, such as solid polymer electrolytes, may be preferred since they can provide stable device operation without electrolyte loss. As an example of such a polymer electrolyte can be a polymer such as polyethyleneoxide, nafion, polypropylene oxide, polyethylene glycol, lithium poly(2-sulfoethyl methacrylate), sodium poly(styrene sulfonate), poly(diallyidimethylammonium chloride), sodium poly(phosphazene sulfonate) combined with any of the following ions: $H^+$, $Li^+$, $Na^+$, $K^+$, $(CH_3)4N^+$, $(C_4H_9)_4N^+$, $NH_4^+$, $Mg^{+2}$, $Ca^{+2}$, $Cl^-$, $Br^-$, $I^-$, $CLO_4^-$, $BF_4^-$, $PF_6^-$, $SO_4^-$, $NO_3^-$, $PO_3^{-2}$, $OH^-$, $CO_3^{-2}$, $CH3COO^-$, $AsF_6^-$, $CF_3SO_3^-$, $CFCOO^-$, $[N(CF_3SO_2)_2]^-$, $[N(CF_3SO_2)(CH_2)_3OCH_3]^-$, $[(CF_3SO_2)_2, CH]^-$.

Solid electrolyte molecular devices of different types are possible. FIG. 1 illustrates a molecular scale device 5 with a distinct molecular storage layer 3 and a distinct electrolyte layer 2 located between a bottom first electrode 4 and a top second electrode 1. The molecular storage layer could range from a single monolayer, or even less, to a layer two or several molecules thick, to a layer many molecules thick, and the electrolyte layer could be of similar thickness As an example of redox active organic, organo-metallic and inorganic materials that could be used for the molecular storage layer are tetracyanoquinodimethane, viologens, tetrathiafulvalene, tetraselenafulvalene, perylene, pyrene, tetramethylphenylenediamine, 2,5-dimethyl-dicyanoquinodiimide, ferrocene, $(C_6Me_3H_3)_2Fe^{+2}$, $(C_6Me_6)_2Ru^{+2}$, $WO_3$, Prussian blue, $MoO_3$, $VO_3$ and various derivatives of these materials.

However a separate electrolyte layer, per se, while useful for some device designs, is not essential. What is needed is the presence of a proton, ion, or other localized charge that is free to move in order to stabilize a conformational or other change in a molecule or group of molecules used in a molecular device. This can be achieved without a dedicated electrolyte layer, for example, by using two molecular layers with contrasting characteristics. By moving protons, ions, or other localized charge from one molecular layer to another a molecular device function can be achieved. Another example would be a single molecular monolayer made of molecules having two complementary redox groups. In a molecule containing both an electron acceptor (for example a viologen or tetracyanoquinodimethane group) a charge can be moved from the donor to the acceptor under an applied external electric field. The movement would be accompanied by a move of a counter-ion to maintain local charge-neutrality of the respective redox groups.

As an example, FIG. 1 illustrates a molecular scale memory device 5 with two molecular layers. The layers are chosen such that one has large conductivity when oxidized and low conductivity when reduced and the second layer has the opposite characteristic, that is, large conductivity when reduced and low conductivity when oxidized. Then by electrically biasing the device to move protons or ions from one layer to the other (that is to reduce one layer and oxidize the other or the reverse) the overall conductivity of the bi-molecular layer device can be changed from high to low or from low to high. Since the conductivity state is stabilized by the position of the protons or ions a stable memory effect can be achieved. A simple example of materials suitable for such a device include viologens or Prussian blue as the first layer and a conducting polymer such as polyaniline, polythiophene, or polypyrrole for the second layer.

Figure 2:
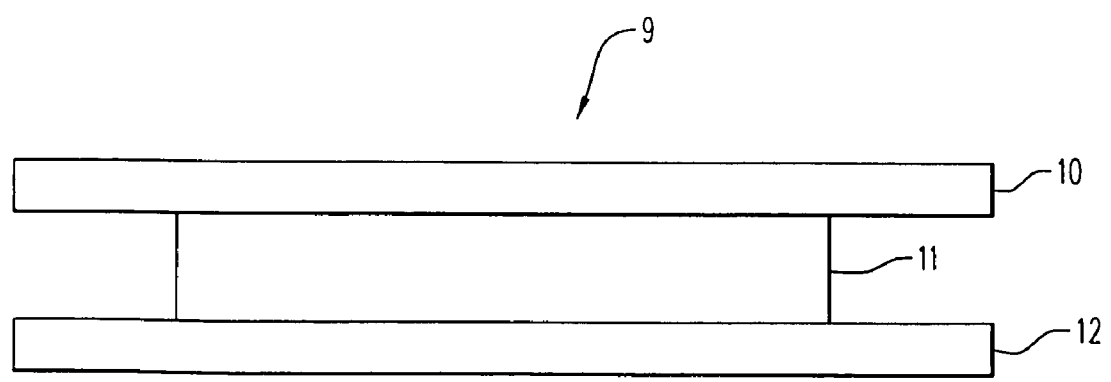
FIG. 2 is a molecular scale device with a single layer having molecular storage material and ion insertion material.

FIG. 2 illustrates a molecular scale device 9 where the molecular storage material and the electrolyte have been combined in a single, mixed layer 11 located between a bottom first electrode 12 and a top second electrode 10. The overall thickness could range from a single monolayer (containing both the molecular storage material and the movable ions), to layers two or several molecules thick, to a layer many molecules thick.

Figure 3:
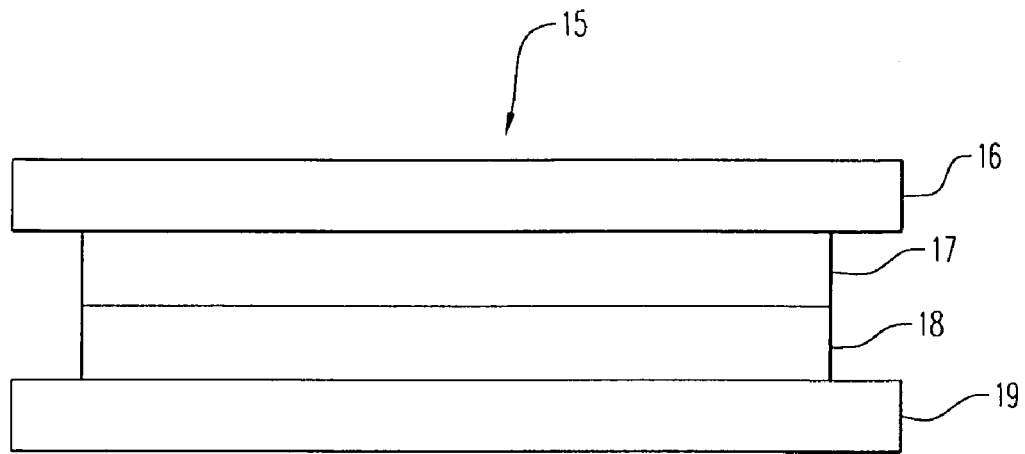
FIG. 3 is a molecular scale device with one transparent electrode, a distinct molecular storage layer and a distinct electrolyte layer.

FIG. 3 demonstrates a molecular scale optoelectronic device 15 with a distinct molecular storage layer 17, and a distinct electrolyte layer 18 sandwiched between a bottom electrode 19, and a transparent top electrode 16. Each layer between the electrodes can range in thickness from a single monolayer to layers two, several or many molecules thick. Electromagnetic radiation (light) entering through the transparent electrode can change the oxidation state of the active molecular storage layer. Movement of counter-ions to maintain local charge-neutrality stabilizes and prolongs the lifetime of the new oxidation state, allowing it to be detected through the two electrodes.

Figure 4:
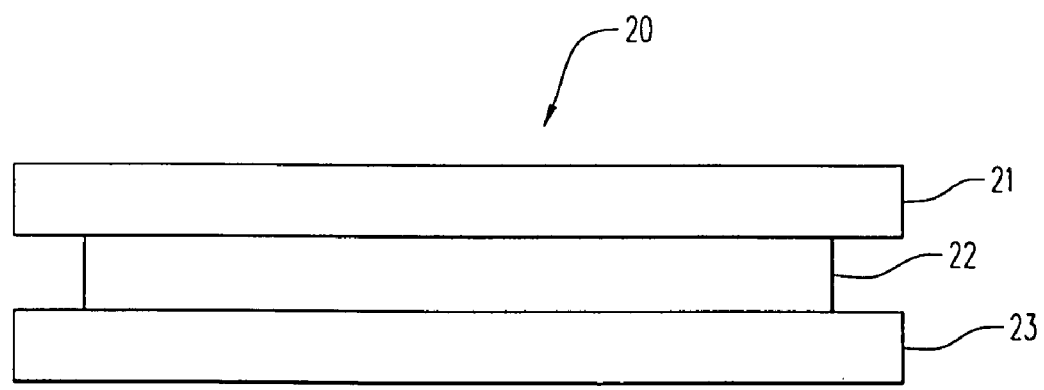
FIG. 4 is a molecular scale device with one transparent electrode and a single layer having molecular storage material and ion insertion material.

Analogous to the device in FIG. 3, FIG. 4 demonstrates a molecular scale optoelectronic device 20 with a single layer 22 sandwiched between bottom electrode 23, and a transparent top electrode 21. The layer between the two electrodes contains both the molecular storage material and the ions or protons which movement is required to maintain a local charge-neutrality during operation of the device. The overall thickness of this layer could range from a single monolayer (containing both the molecular storage material and the movable ions), to layers two, several or many molecules thick.

Devices are possible using a third terminal or other effect, for example light to drive the ion movement that would result in a change in a molecule that would be detected or used at other terminals. For example, photochromic molecules are well known that have large conformational changes on exposure to light. This could be used to stabilize a change in another molecule.

It is also possible to design molecules that localize charge in certain regions, for example using organo-metallic materials. In this case a conformational change in a molecule can be self-stabilized by the movement of the localized charge.

The explicit inclusion of a means or mechanism for proton, ion, or other charge motion will be useful wherever the movement of charge external to a molecule of interest is important. Such movement is useful for a wide range of electronic and/or photonic devices in addition to simple storage or memory devices. In particular, by choosing an electrolyte that makes selective contact to different metals or molecular layers a transistor-like three terminal device can be fabricated, and by choosing an electrolyte whose charge transport changes with chemical or environmental exposure molecular sensors can be made.

Although the present invention describes in detail certain embodiments, it is understood that variations and modifications exist known to those skilled in the art that are within the invention. Accordingly, the present invention is intended to encompass all such alternatives, modifications and variations that are within the scope of the invention as set forth in the following claims.

What is claimed is:

1. A molecular device comprising:
   a first electrode;
   a second electrode;
   a molecular storage layer having a large oxidized state storage layer conductivity and a low reduced state storage layer conductivity; and
   an electrolyte layer contacting said molecular storage layer and having a large reduced state electrolyte layer conductivity and a low oxidized state electrolyte layer conductivity, wherein said molecular storage layer and said electrolyte layer are located between said first electrode and said second electrode, said molecular storage layer connected at a first terminus to said first electrode and said electrolyte layer connected at another terminus to said second electrode, wherein said storage layer and said electrolyte layers together perform memory or logic functions using molecular electrostatic potential based on perturbing an electrostatic potential of at least one molecule within said storage layer by the movement of an ion or a localized charge proximate to said at least one molecule from said electrolyte layer.

2. The device of claim 1 wherein the logic function is selected from the group consisting of AND, OR, NOT, NOR, XOR and any combinations thereof.

3. The molecular device of claim 1, wherein said ion is selected from the group consisting of: $H^+$, $Li^+$, $Na^+$, $K^+$, $(CH_3)_4N^+$, $(C_4H_9)_4N^+$, $NH_4^+$, $Mg^{+2}$, $Ca^{+2}$, $Cl^-$, $Br^-$, $I^-$, $ClO_4^-$, $BF_4^-$, $PF_6^-$, $SO_4^{-2}$, $NO_3^-$, $PO_3^{-2}$, $OH^-$, $CO_3^{-2}$, $CH_3COO^-$, $AsF_6^-$, $CF_3SO_3^-$, $CF_3COO^-$, $[N(CF_3SO_2)_2]^-$, $[N(CF_3SO_2)(CH_2)_3OCH_3]^-$, $[(CF_3SO_2)_2CH]$, or any combinations thereof.

4. The device of claim 1 wherein said electrolyte layer is formed from a polymer selected from the group consisting of: polyethyleneoxide, nafion, polypropylene oxide, polyethylene glycol, lithium poly(2-sulfoethyl methacrylate), sodium poly(styrene sulfonate), poly(diallyidimethylammnonium chloride), and sodium poly(phosphazene sulfonate).

5. The device of claim 1 wherein said molecular storage layer is formed from a compound selected from the group consisting of: tetracyanoquinodimethane, viologens, tetrathiafulvalene, tetraselenafulvalene, perylene, pyrene, tetramethylphenylenediamine, 2,5-dimethyl-dicyanoquinodiimide, ferrocene, $(C_6Me_3H_3)_2Fe^{+2}$, $(C_6Me_6)_2Ru^{+2}$, $WO_3$, Prussian blue, $MoO_3$, and $VO_3$.

6. The device of claim 1 wherein one of said first electrode and said second electrode is optically transparent.

7. The device of claim 1 wherein said molecular storage layer is selected from the group consisting of: a viologen and Prussian blue and said electrolyte layer is selected from the group consisting of: polyaniline, polythiophene, and polypyrrole.

8. The device of claim 1 wherein said molecular storage layer and said electrolyte layer are intermixed as a combined single layer.

9. A molecular device comprising:
   a first electrode;
   a second electrode;
   a first molecular storage layer having a large oxidized state first storage layer conductivity and a low reduced state first storage layer conductivity; and
   a second molecular layer contacting said first molecular layer and having a large reduced state second molecular storage layer conductivity and a low oxidized state second storage layer conductivity, wherein said first molecular storage layer and said second molecular storage layer are located between said first electrode and said second electrode, said first molecular storage layer connected at a first terminus to said first electrode and said second molecular layer connected at another terminus to said second electrode, wherein said first storage layer and said second storage layers together perform memory or logic functions using molecular electrostatic potential based on perturbing an electrostatic potential of at least one molecule in said first molecular storage layer by the movement of an ion or a localized charge proximate to said at least one molecule from said second molecular storage layer.

10. The device of claim 9, wherein the logic function is selected from the group consisting of AND, OR, NOT, NOR, XOR or any combinations thereof.

11. The device of claim 9 wherein one of said first electrode and said second electrode is optically transparent.

12. The device of claim 9 wherein said first molecular storage layer and said second molecular layer are intermixed as a combined single layer.

* * * * *

UNITED STATES PATENT AND TRADEMARK OFFICE
CERTIFICATE OF CORRECTION

PATENT NO. : 7,351,998 B2  
APPLICATION NO. : 10/112075  
DATED : April 1, 2008  
INVENTOR(S) : Thomas N. Jackson Page 1 of 1

It is certified that error appears in the above-identified patent and that said Letters Patent is hereby corrected as shown below:

Column 1, line 30, delete "et a." and insert --et al.--  
Column 1, line 35, delete "Nos." and insert --No.--  
Column 1, line 60, after "invention" delete "is"  
Column 2, line 4, delete "on" and insert --one--  
Column 2, line 17, delete "pertrubing" and insert --perturbing--  
Column 3, line 43, delete "form" and insert --from--  
Column 3, line 57, delete "CLO" and insert --CIO--

Signed and Sealed this

Twelfth Day of August, 2008

JON W. DUDAS  
*Director of the United States Patent and Trademark Office*